US010880508B2

(12) United States Patent
Hosono et al.

(10) Patent No.: US 10,880,508 B2
(45) Date of Patent: Dec. 29, 2020

(54) IMAGE PROCESSING APPARATUS, IMAGING APPARATUS, PIXEL-ABNORMALITY DETECTING METHOD, AND COMPUTER-READABLE RECORDING MEDIUM

(71) Applicant: Olympus Corporation, Hachioji (JP)

(72) Inventors: Yoshiki Hosono, Hachioji (JP); Kazuya Hosono, Chofu (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 16/565,451

(22) Filed: Sep. 9, 2019

(65) Prior Publication Data

US 2020/0007803 A1    Jan. 2, 2020

Related U.S. Application Data

(63) Continuation of application No. PCT/JP2018/007767, filed on Mar. 1, 2018.

(30) Foreign Application Priority Data

Mar. 15, 2017  (JP) .................................. 2017-049741

(51) Int. Cl.
*H04N 5/367* (2011.01)
*H04N 5/359* (2011.01)
(Continued)

(52) U.S. Cl.
CPC ..... *H04N 5/3675* (2013.01); *H01L 27/14607* (2013.01); *H01L 27/14627* (2013.01);
(Continued)

(58) Field of Classification Search
CPC .... H04N 5/3675; H04N 5/3597; H04N 5/379; H04N 9/04551; H04N 9/04557;
(Continued)

(56) References Cited

U.S. PATENT DOCUMENTS 6,625,318 B1 * 9/2003 Tan ........................ H04N 5/367
348/131
9,185,389 B2   11/2015 Aoki
(Continued)

FOREIGN PATENT DOCUMENTS

JP       2001-124984 A     5/2001
JP       2010-0258620      11/2010
(Continued)

OTHER PUBLICATIONS

International Search Report ("ISR") from corresponding International Application No. PCT/JP2018/007767, dated May 22, 2018 (4 pgs.), including the Written Opinion of the International Searching Authority (6 pgs.), English language translation of the ISR (2 pgs.).

*Primary Examiner* — Jason A Flohre
(74) *Attorney, Agent, or Firm* — John C. Pokotylo; Pokotylo Patent Services

(57) ABSTRACT

An image processing apparatus includes: a comparing circuit configured to compare, based on image data generated by an imaging element including a light receiver in which a plurality of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and an estimating circuit configured to estimate an abnormality by using output values of the respective photoelectric converting elements in the unit pixel. The comparing circuit is configured to detect the abnormal output by comparing ratios of output values that are output by the photoelectric converting elements at identical positions in adjacent unit pixels.

17 Claims, 12 Drawing Sheets

(51) Int. Cl.
*H01L 27/146* (2006.01)
*H04N 5/369* (2011.01)

(52) U.S. Cl.
CPC ......... *H04N 5/3597* (2013.01); *H04N 5/3696* (2013.01); *H04N 5/36961* (2018.08)

(58) Field of Classification Search
CPC .......... H04N 9/07; H04N 5/225; H04N 5/232; H04N 5/367
See application file for complete search history.

(56) References Cited

U.S. PATENT DOCUMENTS

| | | | |
|---|---|---|---|
| 9,363,491 B2 | 6/2016 | Kawai et al. | |
| 9,479,688 B2 | 10/2016 | Ishii | |
| 9,571,718 B2 | 2/2017 | Suzuki et al. | |
| 2003/0193011 A1* | 10/2003 | Takeda | H04N 5/367 250/208.1 |
| 2013/0070129 A1 | 3/2013 | Suzuki | |
| 2013/0155271 A1 | 6/2013 | Ishii | |
| 2013/0208152 A1* | 8/2013 | Hsu | H04N 5/367 348/246 |
| 2014/0168387 A1 | 6/2014 | Aoki | |
| 2014/0168484 A1 | 6/2014 | Suzuki et al. | |
| 2014/0232909 A1* | 8/2014 | Inoue | H04N 5/3675 348/246 |
| 2015/0070536 A1* | 3/2015 | Sasaki | H04N 5/367 348/246 |
| 2015/0326838 A1 | 11/2015 | Kawai et al. | |
| 2016/0182794 A1* | 6/2016 | Aoki | H04N 5/3572 348/229.1 |

FOREIGN PATENT DOCUMENTS

| | | |
|---|---|---|
| JP | 2012-134783 A | 7/2012 |
| JP | 2013-148873 A | 8/2013 |
| JP | 2014-057141 A | 3/2014 |
| JP | 2014-171236 A | 9/2014 |
| JP | 2016-167886 A | 9/2016 |
| WO | WO 2013/069445 A1 | 5/2013 |
| WO | WO 2014/136570 A1 | 9/2014 |

* cited by examiner

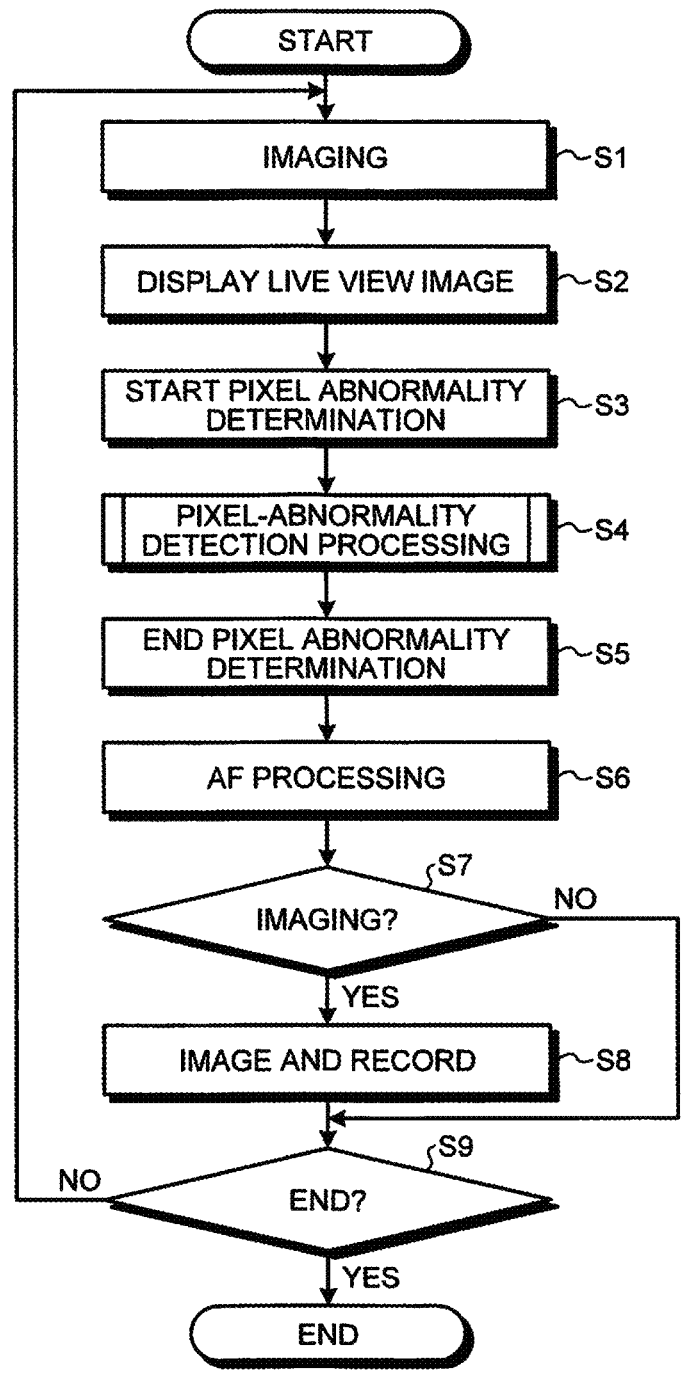

FIG.12

| G1 | | G2 | |
|---|---|---|---|
| PD11 | PD12 | PD21 | PD22 |
| PD13 | PD14 | PD23 | PD24 |

FIG.13

| G1 | | G2 | |
|---|---|---|---|
| 100 | 100 | 10 | 10 |
| 1000 | 100 | 10 | 10 |

IMAGE PROCESSING APPARATUS, IMAGING APPARATUS, PIXEL-ABNORMALITY DETECTING METHOD, AND COMPUTER-READABLE RECORDING MEDIUM

CROSS-REFERENCE TO RELATED APPLICATION

This application is a continuation of PCT International Application No. PCT/JP2018/007767, filed on Mar. 1, 2018, which designates the United States, incorporated herein by reference, and which claims the benefit of priority from Japanese Patent Application No. 2017-049741, filed on Mar. 15, 2017, incorporated herein by reference.

BACKGROUND

1. Technical Field

The present disclosure relates to an image processing apparatus, an imaging apparatus, a pixel-abnormality detecting method, and a computer-readable recording medium for determining a pixel abnormality in an image corresponding to image data that is generated by an imaging unit.

2. Related Art

In the related art, for imaging apparatus such as a digital camera, a technique of detecting a focal point by the pupil-division phase-difference method (refer to JP-A-2001-124984) has been known. In this technique, two photoelectric conversion units and one micro lens are provided per pixel of an imaging apparatus, such as a complementary metal oxide semiconductor (CMOS), and a focal point is detected based on two electrical signals output from the respective two photoelectric converting units.

It is significantly difficult to manufacture such an imaging apparatus such that all of pixels are to be normal pixels at manufacturing. Accordingly, a problem that a pixel abnormality of not outputting an electrical signal according to an amount of incident light occurs is caused. To solve this problem, a technique (refer to JP-A-2014-57141) has been known in which an average value of electrical signals that are output respectively from the predetermined number of photoelectric converting units out of plural photoelectric converting units constituting the imaging element is calculated, and a photoelectric converting unit that has output an electrical signal falling outside a predetermined range based on this average value as a reference is detected as a pixel abnormality. In this technique, a standard deviation of electrical signals respectively output from the predetermined number of photoelectric converting units is calculated, and based on this calculated standard deviation, the number of photoelectric converting units to calculate the average value is set.

SUMMARY

In some embodiments, an image processing apparatus includes: a comparing circuit configured to compare, based on image data generated by an imaging element including a light receiver in which a plurality of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and an estimating circuit configured to estimate an abnormality by using output values of the respective photoelectric converting elements in the unit pixel from which the comparing circuit detects the abnormal output. The comparing circuit is configured to detect the abnormal output by comparing ratios of output values that are output by the photoelectric converting elements at identical positions in adjacent unit pixels.

In some embodiments, an image processing apparatus includes: a comparing circuit configured to compare, based on image data generated by an imaging element including a light receiver in which a plurality of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and an estimating circuit configured to estimate an abnormality by using output values of the respective photoelectric converting elements in the unit pixel from which the comparing circuit detects the abnormal output. When the comparing circuit detects that one of the output values is different from other output values out of the respective output values of the photoelectric converting elements in the unit pixel, the estimating circuit is configured to estimate a photoelectric converting element that has output the one of the output values as a first pixel abnormality.

In some embodiments, an imaging apparatus including: the imaging element; the image processing apparatus; and a lens configured to form an image of a subject on a light receiving surface of the imaging element.

In some embodiments, a pixel-abnormality detecting method includes: comparing, based on image data generated by an imaging element including a light receiver in which a plurality of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and estimating an abnormality by using output values of the respective photoelectric converting elements in the unit pixel from which the abnormal output is detected at the comparing. The comparing includes detecting the abnormal output by comparing ratios of output values that are output by the photoelectric converting elements at identical positions in adjacent unit pixels.

In some embodiments, a non-transitory computer-readable recording medium with an executable program causing an image processing apparatus to execute: comparing, based on image data generated by an imaging element that includes a light receiver in which a plurality of photoelectric converting elements forms a set of a unit pixel and in which a plurality of the unit pixels are arranged in a two-dimensional matrix, and a micro lens that is provided per unit pixel and is layered on a light receiving surface of the unit pixel, output values of the respective photoelectric converting elements per unit pixel to detect an abnormal output; and estimating an abnormality by using output values of the respective photoelectric converting elements in the unit pixel from which the abnormal output is detected at the comparing. The comparing includes detecting the abnormal output by comparing ratios of output values that are output by the photoelectric converting elements at identical positions in adjacent unit pixels.

The above and other features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 6 is a flowchart illustrating an overview of processing performed by the imaging apparatus according to the first embodiment of the disclosure;

FIG. 12 illustrates an example of adjacent unit pixels to be processed by the pixel-abnormality detection processing in FIG. 11;

FIG. 13 schematically illustrates output values of respective PDs of the adjacent unit pixels in FIG. 12;

DETAILED DESCRIPTION

Hereinafter, forms to implement the disclosure (hereinafter, "embodiments") are described with reference to the drawings. Note that the embodiments described in the following are not intended to limit the disclosure. Furthermore, it is described with like reference symbols given to like parts in description of the drawings. Moreover, in the following description, an image processing apparatus used in an imaging apparatus is explained as an example of the image processing apparatus.

First Embodiment

Configuration of Imaging Apparatus

Figure 1:
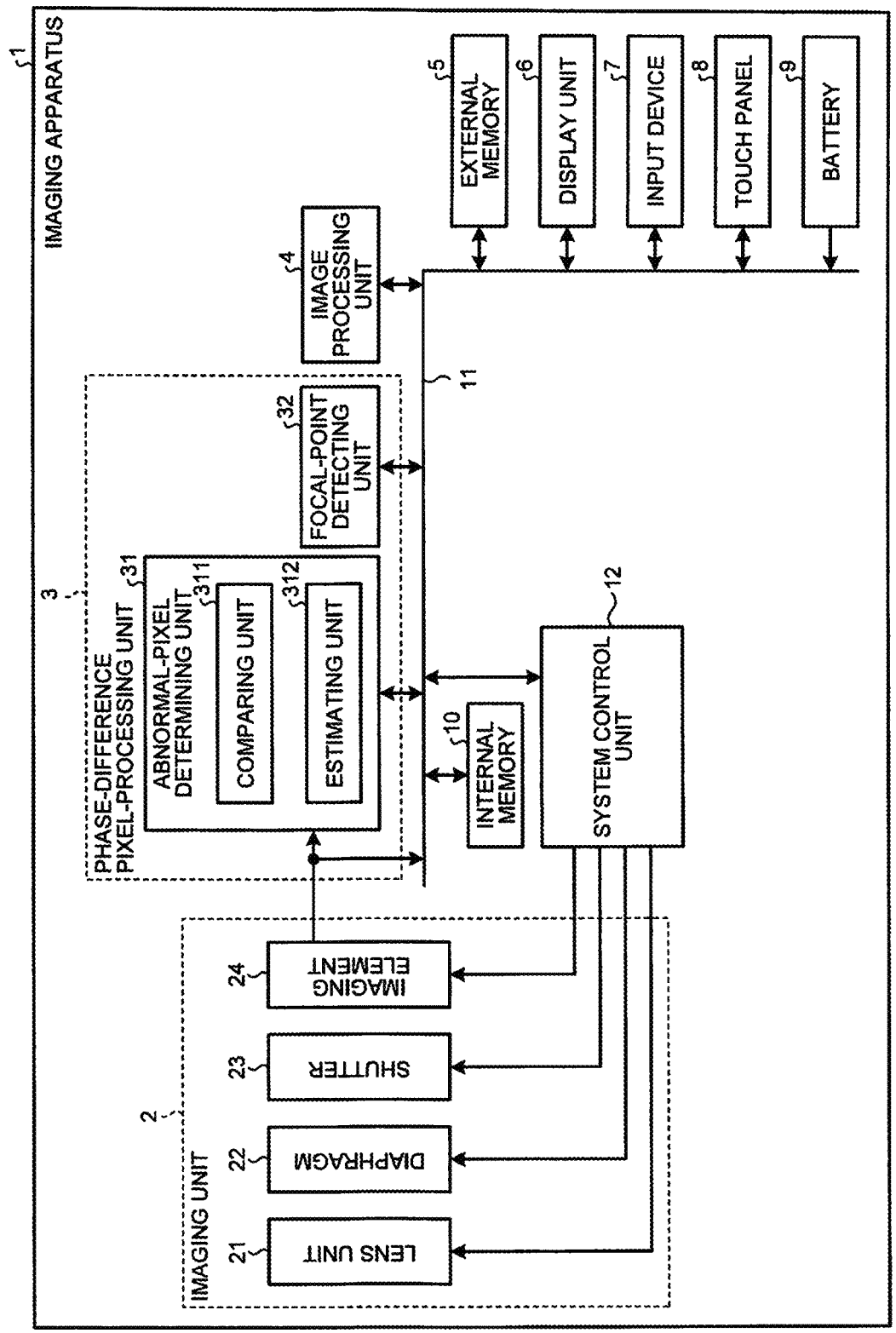
FIG. 1 is a block diagram illustrating a functional configuration of an imaging apparatus according to a first embodiment of the disclosure.

FIG. 1 is a block diagram illustrating a functional configuration of an imaging apparatus according to a first embodiment of the disclosure. An imaging apparatus 1 illustrated in FIG. 1 includes an imaging unit 2, a phase-difference pixel-processing unit 3, an image processing unit 4, an external memory 5, a display unit 6, an input device 7, a touch panel 8, a buttery 9, an internal memory 10, a bus 11, and a system control unit 12.

The imaging unit 2 images a subject and generates image data, and outputs this generated image data to the phase-difference pixel-processing unit 3 and the bus 11. The imaging unit 2 includes a lens unit 21, a diaphragm 22, a shutter 23, and an imaging element 24.

The lens unit 21 forms an image of the subject on a light receiving surface of the imaging element 24. The lens unit 21 is constituted of plural lenses, and performs zooming or focusing with respect to the subject under control of the system control unit 12.

The diaphragm 22 adjusts exposure by controlling an incident amount of light gathered by the lens unit 21, under control of the system control unit 12.

The shutter 23 switches between an exposed state and shielded state of the imaging element 24 under control of the system control unit 12. The shutter 23 is structured by using, for example, a focal plane shutter, or the like.

The imaging element 24 receives a light beam of a subject image that is gathered by the lens unit 21 and subjects it to photoelectric conversion, to thereby generate image data (an electronic signal), and outputs the image data to the phase-difference pixel-processing unit 3 and the bus 11, under control of the system control unit 12.

Detailed Configuration of Imaging Element

A detailed configuration of the imaging element 24 described above is herein explained.

Figure 2:
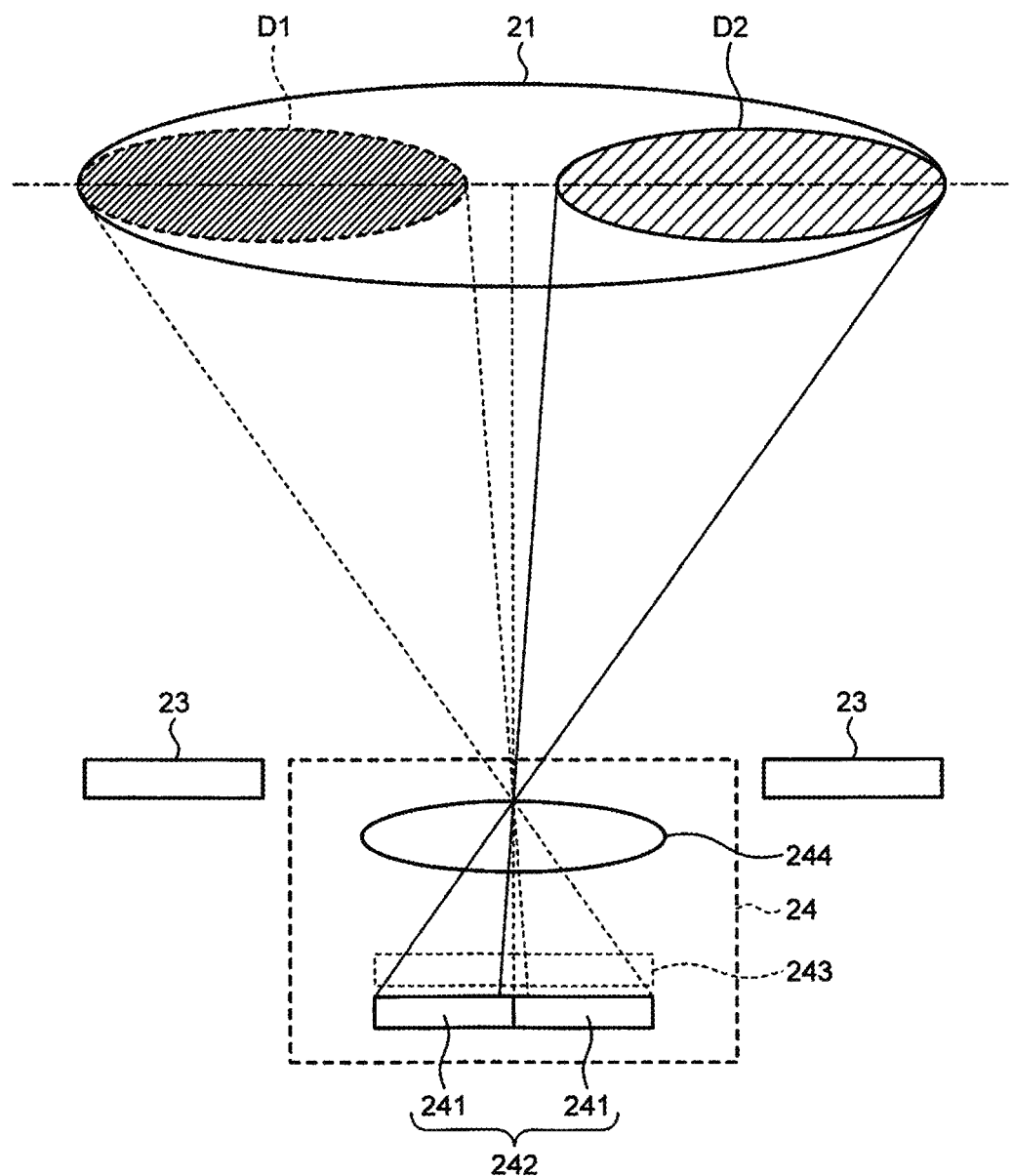
FIG. 2 is a cross-section schematically illustrating a configuration of an imaging unit that includes an imaging element according to the first embodiment of the disclosure.
Figure 3:
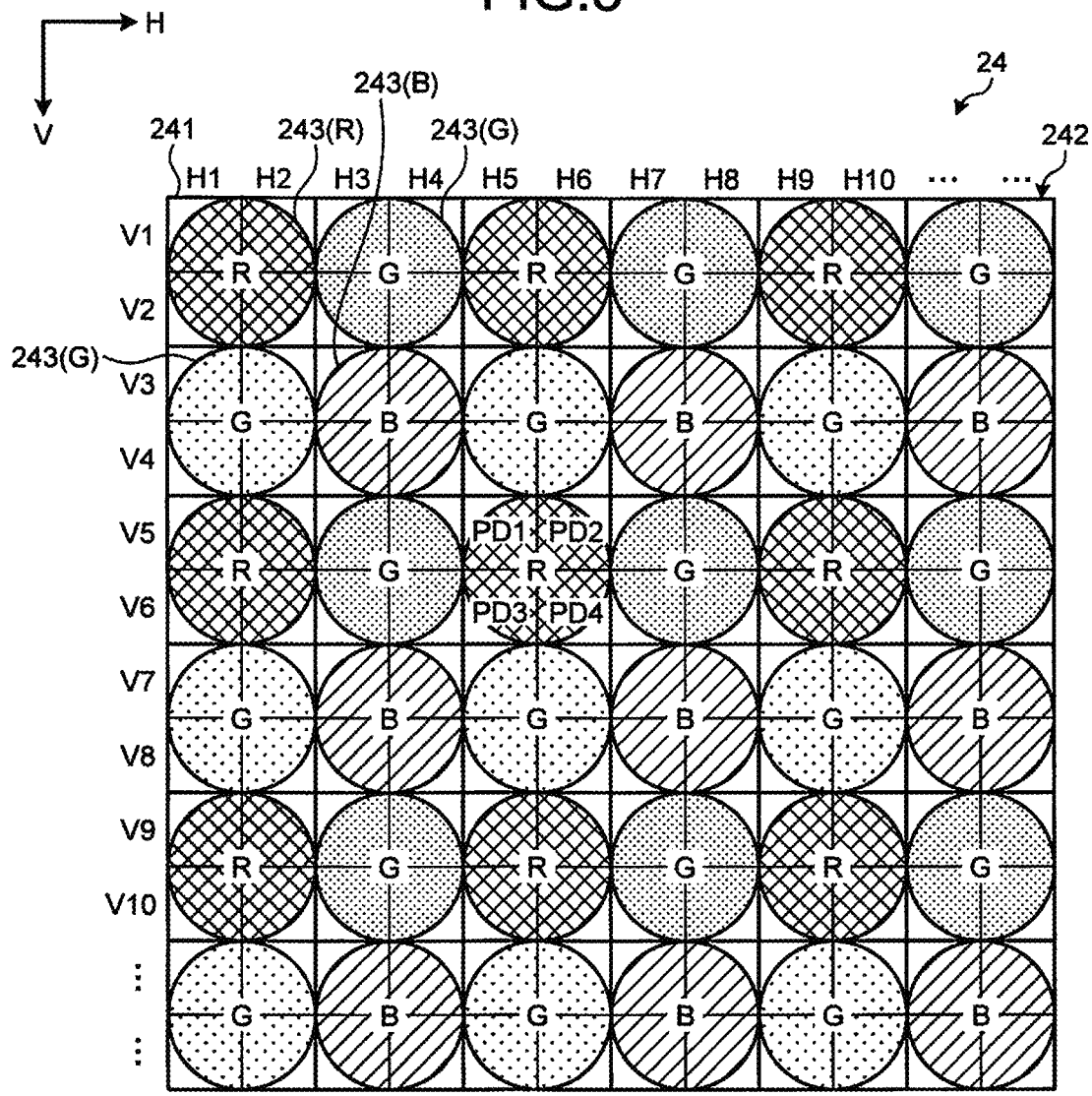
FIG. 3 is a plan view schematically illustrating a configuration of the imaging element according to the first embodiment of the disclosure.
Figure 4:
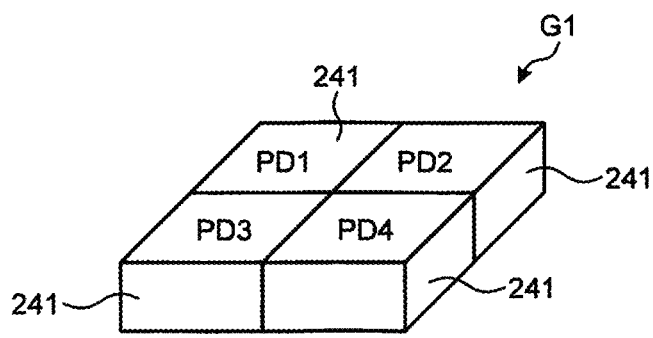
FIG. 4 is a perspective view schematically illustrating a configuration of a unit pixel of the imaging element according to the first embodiment of the disclosure.

FIG. 2 is a cross-section schematically illustrating a configuration of the imaging unit 2 that includes the imaging element 24. FIG. 3 is a plan view schematically illustrating a configuration of the imaging element 24. FIG. 4 is a perspective view schematically illustrating a configuration of a unit pixel of the imaging element 24. Note that it is described regarding a horizontal direction as Hn (n=a positive integer equal to or larger than 1), and a vertical direction as Vn (n=a positive integer equal to or larger than 1).

As illustrated in FIG. 2 to FIG. 4, the imaging element 24 includes a light receiver 242 in which plural unit pixels G1 are arranged in a two-dimensional matrix, handling plural photoelectric converting elements 241 as a set of the unit pixel G1; a color filter 243 in a Bayer pattern in which filters (an R filter, a G filter, and a B filter) that pass light of either one of R (red), G (green), and B (blue) are layered per unit pixel G1, and a micro lens 244 that is arranged per unit pixel G1. The imaging element 24 thus configured receives light beams that have passed through one of a pupil exit D1, a pupil exit D2, a pupil exit D3 (not shown), and pupil exit D4 (not shown) of the lens unit 21 and through the micro lens 244 by the respective photoelectric converting elements 241 at light receiving positions different from one another per unit pixel G1. Although the configuration of a part of the imaging element 24 has been described in FIG. 3, a similar photoelectric converting element division structure is formed on the entire area on the imaging element 24, and it is formed not only in a specific area (for example, a central area).

Figure 5A:
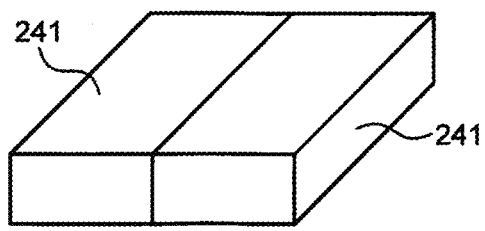
FIG. 5A is a perspective view schematically illustrating another configuration of a unit pixel of the imaging element according to the first embodiment of the disclosure.
Figure 5B:
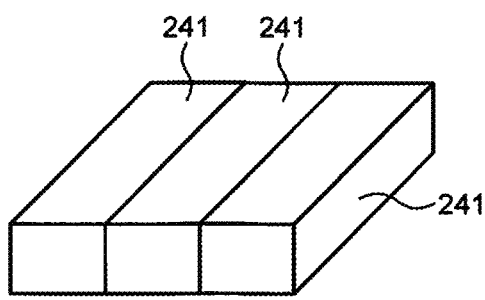
FIG. 5B is a perspective view schematically illustrating another configuration of a unit pixel of the imaging element according to the first embodiment of the disclosure.
Figure 5C:
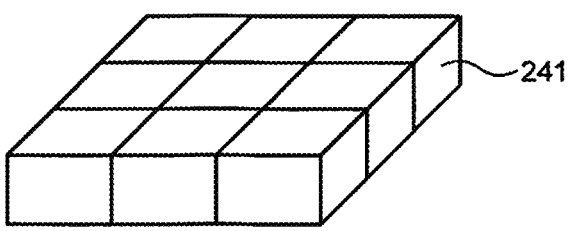
FIG. 5C is a perspective view schematically illustrating another configuration of a unit pixel of the imaging element according to the first embodiment of the disclosure.

Moreover, four pieces of the photoelectric converting elements 241 constitutes the unit pixel G1 in the first embodiment, but it is not limited thereto. As illustrated in FIG. 5A to FIG. 5C, two or more pieces of the photoelectric converting elements 241 may be a set to constitute the unit pixel G1. Preferably, three or more pieces of the photoelectric converting elements 241 constitute the unit pixel G1 in a set, and more preferably, four or more pieces of the photoelectric converting elements 241 may constitute the unit pixel G1 in a set. In this case, similarly to FIG. 4, the pupil exit of the lens unit 21 is set according to the number of the photoelectric converting elements 241. For example, as illustrated in FIG. 5C, when nine pieces of the photoelectric converting elements 241 in 3×3 constitute a unit pixel, the number of pupil exits of the lens unit 21 is set to nine, and the number of the micro lens 244 is set to one.

Referring back to FIG. 1, description of the configuration of the imaging apparatus 1 is continued.

The phase-difference pixel-processing unit 3 detects a focal state of the imaging unit 2 based on the image data generated by the imaging unit 2, and compares respective output values of the photoelectric converting elements 241 constituting the unit pixel G1, to detect an abnormal output per unit pixel G1. The phase-difference pixel-processing unit 3 includes an abnormal-pixel determining unit 31 and a focal-point detecting unit 32. In the first embodiment, the phase-difference pixel-processing unit 3 functions as the image processing apparatus.

The abnormal-pixel determining unit 31 compares the respective output values of the photoelectric converting elements 241 constituting the unit pixel G1 per unit pixel G1 based on the image data generated by the imaging unit 2 to detect an abnormal output, and estimates an abnormality by using respective output values of the photoelectric converting elements 241 in the unit pixel G1 from which this abnormal output is detected. The abnormal-pixel determining unit 31 includes a comparing unit 311 and an estimating unit 312.

The comparing unit 311 detects an abnormal output by comparing respective output values of the photoelectric converting elements 241 constituting the unit pixel G1 per unit pixel G1. The comparing unit 311 is realized by use of a central processing unit (CPU) or various arithmetic operation circuits.

The estimating unit 312 estimates an abnormality by using respective output values of the photoelectric converting elements 241 in the unit pixel G1 from which an abnormal output is detected by the comparing unit 311. Specifically, the comparing unit 311 estimates, when one output value differs from other output values among respective output values of photoelectric converting elements 241 in the unit pixel G1, the photoelectric converting element 241 that has output the one output value as a first pixel abnormality. The first pixel abnormality is a flashing failure (flashing failure pixel) or a flashing failure that is caused by long exposure (flashing failure pixel that is caused by long exposure). Moreover, the estimating unit 312 estimates, when some of output values are at different levels from the other output values among respective output values of the photoelectric converting elements 241 in the unit pixel G1, the photoelectric converting elements 241 that have output the output values as a second pixel abnormality. The second pixel abnormality is that output values show abnormality by ghost light (abnormal pixel). Furthermore, the estimating unit 312 estimates an incident direction of the ghost light that has entered the imaging unit 2 from positions of the photoelectric converting element 241 corresponding to the second pixel abnormality and the other photoelectric converting elements 241. The estimating unit 312 is realized by use of a CPU or various arithmetic operation circuits.

The focal-point detecting unit 32 detects a focal state of the imaging unit 2 based on the image data generated by the imaging unit 2, and outputs this detected result to the system control unit 12.

The image processing unit 4 subjects the image data generated by the imaging unit 2 to predetermined image processing, and output it to the display unit 6 or the external memory 5. The predetermined image processing is basic image processing including, at least, optical black subtraction processing, white balance adjustment processing, synchronization processing, color matrix calculation processing, γ correction processing, color reproduction processing, edge enhancement processing, noise reduction processing, and the like.

The external memory 5 is constituted of a memory card inserted externally from outside the imaging apparatus 1, is detachably mounted on the imaging apparatus 1 through a memory interface (I/F) (not shown), and stores image data (RAW data) or moving image data generated by the imaging unit 2, and image data subjected to image processing by the image processing unit 4 (compressed data in the joint photographic experts group (JPEG) format). Moreover, the external memory 5 outputs a program, image data, and various kinds of information stored through the bus 11 under control of the system control unit 12.

The display unit 6 displays an image corresponding to the image data input through the bus 11 and various kinds of information of the imaging apparatus 1 under control of the system control unit 12. The display unit 6 is constituted of a liquid crystal, an organic electroluminescence (EL), or the like.

The input device 7 gives various kinds of instructions of the imaging apparatus 1. Specifically, the input device 7 includes a power switch to switch between an on state and an off state of a power source of the imaging apparatus 1, a release button to give an instruction for still image shooting, an operating switch to switch various kinds of settings of the imaging apparatus 1, a moving image switch to give an instruction for moving image shooting, and the like.

The touch panel 8 is arranged in a superimposed manner on a display area of the display unit 6, detects a contact position at which an object touches externally, and outputs a signal according to the detected contact position to the bus 11.

The buttery 9 is constituted of a battery and a booster circuit, and supplies power to respective components of the imaging apparatus 1.

The internal memory 10 stores various kinds of programs executed by the imaging apparatus 1 and various kinds of information being processed. Moreover, the internal memory 10 temporarily stores image data input from the imaging unit 2 through the bus 11, and the like. The internal memory 10 is constituted of a synchronous dynamic random-access memory (SDRAM), or a flash memory.

The bus 11 is constituted of a transmission path that connects the respective components of the imaging apparatus 1, and transfers various kinds of data generated in the imaging apparatus 1 to the respective components of the imaging apparatus 1.

The system control unit 12 overall controls the respective parts of the imaging apparatus 1. The system control unit 12 is constituted of a central processing unit (CPU), an application specific integrated circuit (ASIC), or the like.

Processing of Imaging Apparatus

Next, processing performed by the imaging apparatus 1 is described.

FIG. 6 is a flowchart illustrating an overview of processing performed by the imaging apparatus 1. As illustrated in FIG. 6, the system control unit 12 causes the imaging unit 2 to perform imaging (step S1), and causes the display unit 2 to display a live view image corresponding to the image data generated by the imaging unit 2 (step S2).

Subsequently, the abnormal-pixel determining unit 31 starts pixel abnormality determination with respect to the image data generated by the imaging unit 2 (step S3).

Thereafter, the abnormal-pixel determining unit 31 performs pixel-abnormality detection processing to detect a pixel abnormality by comparing respective output values of the photoelectric converting elements 241 that constitute the unit pixel G1 per unit pixel G1 based on the image data generated by the imaging unit 2 (step S4), and ends the pixel abnormality determination (step S5). Details of the pixel-abnormality detection processing are described later.

Subsequently, the focal-point detecting unit 32 detects a focal state of the imaging unit 2 based on the image data generated by the imaging unit 2, and brings it into focus at a focal point (step S6).

Thereafter, when an operation for imaging is input to the input device 7 (step S7: YES), the system control unit 12 causes the imaging unit 2 to perform imaging, and stores image data that is generated by causing the image processing unit 4 to perform predetermined image processing with respect to the image data generated by the imaging unit 2 in the external memory 5 (step S8). In this case, the system control unit 12 records position information relating to a position of the photoelectric converting element 241 that has been estimated as abnormal in the imaging element 24 detected by the abnormal-pixel determining unit 31 at step S4 described above (pixel coordinates in the imaging element 24), a type of pixel abnormality (for example, an abnormality by a flashing failure or a ghost), and image data in an associated manner in the external memory 5. For example, the system control unit 12 records in the external memory 5 by writing the position information of a pixel abnormality and the type of a pixel abnormality in Exif of the image data. Note that the system control unit 12 may record position information (coordinates) relating to a position of the photoelectric converting element 241 that has been estimated as abnormal in the imaging element 24 detected by the abnormal-pixel determining unit 31 at step S4 described above and the type of an abnormality in the internal memory 10.

Subsequently, when an ending operation is input to the input device 7 (step S9: YES), the imaging apparatus 1 ends this processing. On the other hand, when an ending operation is not input to the input device 7 (step S9: NO), the imaging apparatus 1 returns to step S1 described above.

At step S7, when an operation for imaging is not input to the input device 7 (step S7: NO), the imaging apparatus 1 shifts to step S9.

Pixel-Abnormality Detection Processing

Figure 7:
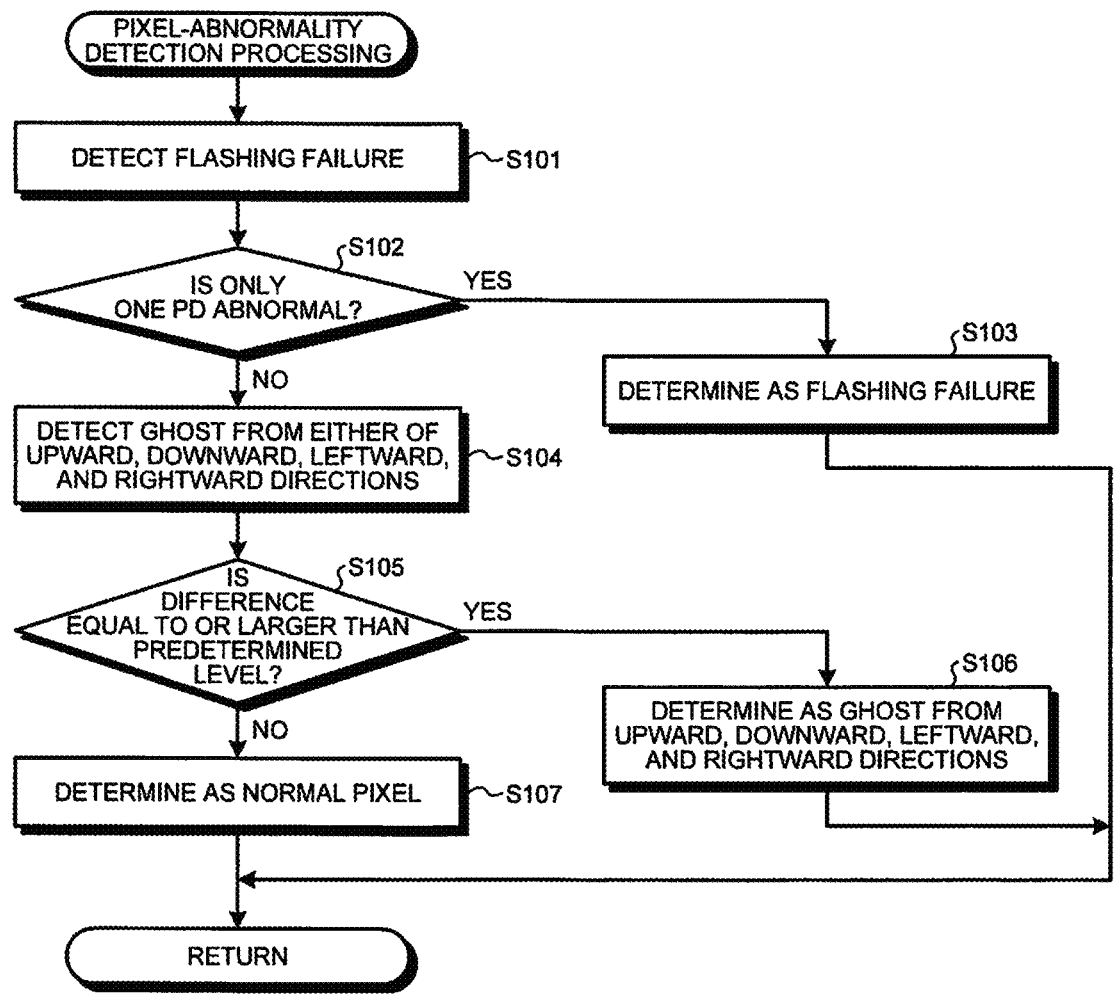
FIG. 7 is a flowchart illustrating an overview of pixel-abnormality detection processing in FIG. 6.
Figure 8:
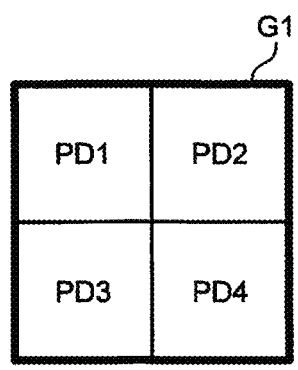
FIG. 8 illustrates an example of a unit pixel processed by the pixel-abnormality detection processing in FIG. 7.

Next, details of the image-abnormality detection processing at step S4 in FIG. 6 described above are explained. FIG. 7 is a flowchart illustrating an overview of the pixel-abnormality detection processing performed by the abnormal-pixel determining unit 31. In FIG. 7, an example in which a pixel abnormality is detected from the unit pixel G1 constituted of four pieces of the photoelectric converting elements 241 (hereinafter, "PD1", "PD2", "PD3", and "PD4" from the left) as one set as illustrated in FIG. 8 is described. Moreover, to signify either one out of the four PDs of PD1 to PD4 in the following, it is described expressing simply as "PD". Furthermore, in the following, the pixel-abnormality detection processing performed with respect to a single piece of the unit pixel G1 is described for convenience of description, but the abnormal-pixel determining unit 31 performs similar pixel-abnormality detection processing with respect to all of the unit pixels G1 constituting the imaging element 24.

Figure 9:
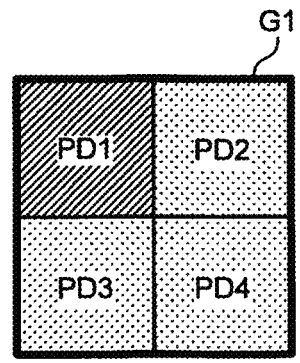
FIG. 9 illustrates a state in which a flashing failure has occurred in one PD in the pixel-abnormality detection processing in FIG. 7.

As illustrated in FIG. 7, first, the comparing unit 311 starts detection of a flashing failure (step S101), compares output values output respectively by the four PD1 to PD4 constituting the unit pixel G1 based on the image data generated by the imaging unit 2, and determines that an abnormality is caused in only one PD based on that one output value is larger than the other output values among the output values (step S102). When performing comparison of output values, the comparing unit 311 may acquire a threshold from a property in an amount of light entering the imaging element 24 from the lens unit 21. Specifically, because diameters of the pupil exits D1, D2 and a distance from an image forming surface on the micro lens 244 to the pupil exits D1, D2 determine an angle (Fno of a pupil exit), a value calculated from the property of the imaging element grasped in advance is used as a threshold. The threshold may be varied according to Fno of a pupil exit and a position of the imaging element 24 (a central part or a peripheral part). Because the threshold varies according to a subject, it is defined by magnification. As an example, when there is a possibility of having a fivefold difference, based on whether the magnitude relationship in brightness difference is fivefold or more than fivefold as a threshold, whether it is abnormal can be determined. For this threshold, a coefficient for which a noise and a subject brightness are considered may be used. When the brightness level of the subject is low, it is considered that an erroneous determination is made as an influence of a noise increases. Therefore, the threshold enabled to be set according to the brightness level of a subject. It is used also for a level difference to be determined at step S105. Moreover, the above determination is used also in a second embodiment and a third embodiment described later when output comparison is performed. When the comparing unit 311 determines that only one PD is in an abnormal state (step S102: YES), the estimating unit 312 determines a PD that has output an output value larger than the other output values out of the four PD1 to PD4 constituting the unit pixel G1 as a flashing failure (step S103). Specifically, when the output value of the PD1 is larger than the output values of the other PD2 to PD4 (PD1>PD2, PD3, PD4) as illustrated in FIG. 9, the estimating unit 312 determines the PD1 that has output the output value larger than the other output values of the other PD2 to PD4 as a flashing failure, which is the first pixel failure. When the threshold is set to fivefold, it is determined whether it has a fivefold level difference with respect to the maximum value of the PD2 to PD4. After step S103, the imaging apparatus 1 returns to a main routine in FIG. 6.

At step S102, when the comparing unit 311 does not determine that only one PD is in an abnormal state (step S102: NO), the imaging apparatus 1 shifts to step S104.

Figure 10:
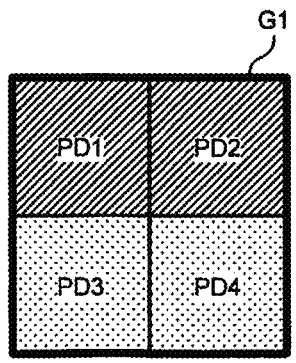
FIG. 10 illustrates a state in which a ghost is formed by incident light from a downward direction with respect to a unit pixel in the pixel-abnormality detection processing in FIG. 7.

Subsequently, the comparing unit 311 starts detection of a ghost either from an upward, downward, rightward, and leftward directions (step S104), and performs comparison to determine whether a difference in a predetermined level or more is generated between output values of a top and bottom pair of PDs or a left and right pair of PDs, among output values output by the respective four PD1 to PD4 constituting the unit pixel G1 (step S105). When the comparing unit 311 determined that there is a difference at the predetermined level or more between the respective output values of the top and bottom pair of PDs or the left and right pair of PDs that are out of the output values output by the respective four PD1 to PD4 constituting the unit pixel G1 (step S105: YES), the estimating unit 312 determines that it is a ghost by incident light from the up and down or left and right direction (step S106). Specifically, when a ghost is formed by incident light from the downward direction as illustrated in FIG. 10, and when a mean output value of an upper pair of the PD1 and the PD2 is larger than a mean output value of a lower pair of the PD3 and the PD4 ((PD1+PD2)/2>(PD3+PD4)/2), the estimating unit 312 determines it as the second pixel abnormality in which a ghost is formed in the PD1 and the PD2 by incident light from the downward direction. On the other hand, when a mean output value of the lower pair of the PD3 and the PD4 is larger than a mean output value of the upper pair of the PD1 and the PD2 ((PD1+PD2)/2<(PD3+PD4)/2), the estimating unit 312 determines it as the second pixel abnormality in which a ghost is formed in the PD3 and the PD4 by incident light from the upward direction. Moreover, when a ghost is formed by incident light from the rightward direction, and when a mean output value of a right pair of the PD2 and the PD4 is larger than a mean output value of a left pair of the PD1 and the PD3 ((PD2+PD4)/2>(PD1+PD3)/2), the estimating unit 312 determines it as the second pixel abnormality in which a ghost is formed in the PD2 and the PD4 by incident light from the rightward direction. Furthermore, when a mean output value of the left pair of the PD1 and the PD3 is larger than a mean output value of the right pair of the PD2 and the PD4 ((PD2+PD4)/2<(PD1+PD3)/2), the estimating unit 312 determines it as the second pixel abnormality in which a ghost is formed in the PD1 and the PD3 by incident light from the leftward direction. After step S106, the imaging apparatus 1 returns to the main routine in FIG. 6.

At step S105, when the comparing unit 311 determines that there is no difference at the predetermined level or more between the respective output values of the top and bottom pair of PDs or the left and right pair of the PDs out of the output values output by the respective four PD1 to PD4 constituting the unit pixel G1 (step S105: NO), the imaging apparatus 1 shifts to step S107.

The estimating unit 312 that has determined that there is no difference in output values of the rest of the PDs determines that the respective PD1 to PD4 constituting the unit pixel G1 as normal pixels (step S107). After step S107, the imaging apparatus 1 returns to the main routine in FIG. 6.

According to the first embodiment of the disclosure described above, the comparing unit 311 compares respective output values of the photoelectric converting elements 241 per unit pixel G1, to detect an abnormal output, and an abnormality is estimated by using the respective output values of the photoelectric converting elements 241 in the unit pixel G1 in which the abnormal output has been detected by the comparing unit 311. Therefore, a pixel abnormality can be detected in real time.

Moreover, according to the first embodiment of the disclosure, when the comparing unit 311 detects that one output value is different from the other output values out of respective output values of the photoelectric converting elements 241 in the unit pixel G1, the estimating unit 312 can detect the photoelectric converting element 241 that has output the output value as a flashing failure pixel, which is the first pixel abnormality.

Furthermore, according to the first embodiment of the disclosure, the comparing unit 311 detects that some of output values are at a different level from the other output values out of respective output values of the photoelectric converting elements 241 in the unit pixel G1, the photoelectric converting elements 241 that have output the output values as the second abnormality.

In the first embodiment of the disclosure, the estimating unit 312 detects a pixel abnormality each time image data is generated by the imaging unit 2, but an abnormality may be estimated by using respective output values of the photoelectric converting elements 241 in the unit pixel G1, for example, according to an instruction signal to instruct to perform estimation by the estimating unit 312 from the input device 7. That is, the estimating unit 312 may estimate an abnormality by using respective output values of the photoelectric converting elements 241 in the unit pixel G1 depending on whether pixel-abnormality detection mode setting is made according to an operation of the input device 7.

Furthermore, in the first embodiment, when the estimating unit 312 detects a flashing failure pixel, which is an abnormal pixel, the image processing unit 4 may correct a pixel value of the flashing failure pixel. For example, the image processing unit 4 corrects a pixel value of a flashing failure pixel by following two correction methods. Specifically, a correction method that is performed by the image processing unit 4 when the PD1, the coordinates of which are H5, V5 in FIG. 3 is detected as a flashing failure pixel is described.

Correction Method 1

The image processing unit 4 performs correction by using pixel values of PDs (the PD2 (H6, V5), the PD3 (H5, V6), and the PD4 (H6, V6)) in the same unit pixel.

Specifically, the image processing unit 4 corrects the pixel value of the PD1 (H5, V5) that is the flashing failure pixel by three-point interpolation (a mean value of pixel values) with the pixel value of the PD2 (H6, V5), the pixel value of the PD3 (H5, V6), and the pixel value of the PD4 (H6, V6).

Correction Method 2

The image processing unit 4 performs correction by using a pixel value of a PD at the same position in an adjacent unit pixel.

Specifically, the image processing unit 4 corrects a pixel value of the PD1 (H5, V5) that is a flashing failure pixel by performing up, down, left, and right interpolation (mean value of pixel values) with respective pixel values of the PD1 (H9, V5), the PD1 (H5, V1), the PD1 (H1, V5), and the PD1 (H9, V5).

When performing the correction methods described above, the image processing unit 4 exclude, when a pixel to be used for correction is determined as a flashing failure pixel by the estimating unit 312, the pixel from pixels to be used for correction, and performs correction by using pixel values of the rest of the pixels.

Second Embodiment

Next, a second embodiment of the disclosure is described. An imaging apparatus according to the second embodiment has the same configuration as the imaging apparatus 1 according to the first embodiment described above, but differs in pixel-abnormality detection processing that is performed by an abnormal-pixel determining unit included in the imaging apparatus. Specifically, while whether it is a pixel abnormality is estimated by comparing respective pixel values output by the four PD1 to PD4 constituting a single piece of the unit pixel G1 in the first embodiment, whether it is a pixel abnormality is estimated by comparing ratios of output values that are output by PDs at the same light receiving position in adjacent unit pixels in the second embodiment. In the following, the pixel-abnormality detection processing performed by the abnormal-pixel determining unit included in the imaging apparatus according to the second embodiment is described. Note that like reference symbols are given to like parts to the imaging apparatus 1 according to the first embodiment described above, and description thereof is omitted.

Pixel-Abnormality Detection Processing

Figure 11:
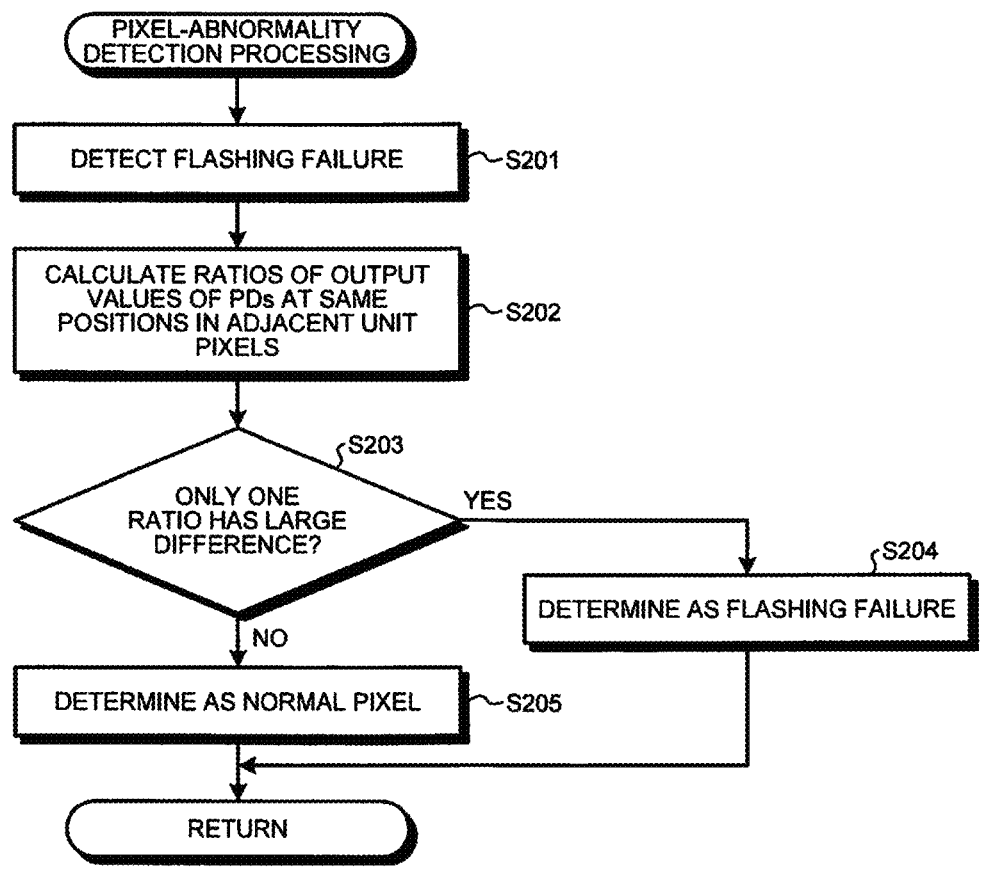
FIG. 11 is a flowchart illustrating an overview of pixel-abnormality detection processing performed by an abnormal-pixel determining unit according to a second embodiment of the disclosure.

FIG. 11 is a flowchart illustrating an overview of the pixel-abnormality detection processing performed by the abnormal-pixel determining unit 31 according to the second embodiment of the disclosure. In FIG. 11, a set constituted of four pieces of the photoelectric converting elements 241 is referred to as the unit pixel G1 (a PD11, a PD12, a PD13, a PD14), and a set constituted of four pieces of the photoelectric converting elements 241 that is adjacent to this unit pixel G1 and on which a filter of the same color (for example, an R filter) is layered is referred to as a unit pixel G2 (a PD21, a PD22, a PD23, a PD24) as illustrated in FIG. 12. Moreover, in the following, to signify either one out of the eight pieces of the PD11 to PD14 and the PD21 to the PD24, it is described, expressing simply as "PD". Furthermore, FIG. 13 schematically illustrates output values of respective PDs of the unit pixels G1 and G2. Moreover, in the following, the pixel-abnormality detection processing performed with respect to two pieces of the unit pixels G1, G2 is described for convenience of explanation, but the abnormal-pixel determining unit 31 performs similar pixel-abnormality detection processing with respect to all of the unit pixels G1 constituting the imaging element 24.

As illustrated in FIG. 11, first, the comparing unit 311 starts detection of a flashing failure (step S201), and calculates a ratio of output values of PDs at the same positions in the adjacent unit pixels G1, G2 (step S202). Specifically, as illustrated in FIG. 12, the comparing unit 311 calculates a ratio of each of output values of the PD11/PD21, PD12/PD22, PD13/PD23, PD14/PD24. Specifically, as illustrated in FIG. 13, ratios of respective output values of PD11/PD21=100/10, PD12/PD22=100/10, PD13/PD23=1000/10, and PD14/PD24=100/10.

Subsequently, the comparing unit 311 determines that only one ratio has a large difference among the ratios of four light receiving positions in the adjacent unit pixels G1, G2 (step S203: YES), the estimating unit 312 determines it as a flashing failure (step S204). In this case, the estimating unit 312 determines that a PD at a light receiving position, the ratio of which is different from the other ratios as a flashing failure. Specifically, as illustrated in FIG. 12 and FIG. 13, the estimating unit 312 determines the PD13 and the PD23 as candidates of a flashing failure because the ratio of the output values, PD13/PD23 is different from the other ratios in the unit pixel G1 and the unit pixel G2. The comparing unit 311 then compares the respective output values of the PD11 to the PD14 in the unit pixel G1. Thereafter, when the comparing unit 311 determines that the output value of the PD13 is larger than the output values of the PD11, PD12, and PD14, the estimating unit 312 determines that the PD13 is in the first pixel abnormality in which a flashing failure has occurred. On the other hand, when there is no difference in output values of the PD11 to PD14 in the unit pixel G1, the estimating unit 312 performs similar determination with respect to the unit pixel G2, and determines that a PD, the output value of which is large is in the first pixel abnormality in which a flashing failure has occurred based on a result of comparison of the output values of the PD21 to PD24 by the comparing unit 311. After step S204, the imaging apparatus 1 returns to the main routine in FIG. 6.

At step S203, when the comparing unit 311 determines that only one ratio has not large difference among ratios at four light receiving positions in the adjacent unit pixels G1, G2 (step S203: NO), the estimating unit 312 determines that the respective PDs constituting the unit pixels G1, G2 as normal pixels (step S205). After step S205, the imaging apparatus 1 returns to the main routine in FIG. 6.

According to the second embodiment of the disclosure described above, similar effect to that of the first embodiment described above is produced, and a pixel abnormality can be detected in real time.

Third Embodiment

Next, a third embodiment of the disclosure is described. An imaging apparatus according to the third embodiment has the same configuration as the imaging apparatus 1 according to the first embodiment described above, but differs in pixel-abnormality detection processing that is performed by the imaging apparatus. Specifically, a flashing failure is determined by determining whether there are variations in output values in the unit pixels in the third embodiment. In the following, the pixel-abnormality detection processing performed by the imaging apparatus according to the third embodiment is described. Note that like reference symbols are given to like parts to the imaging apparatus 1 according to the first embodiment described above, and description thereof is omitted.

Pixel-Abnormality Detection Processing

Figure 14:
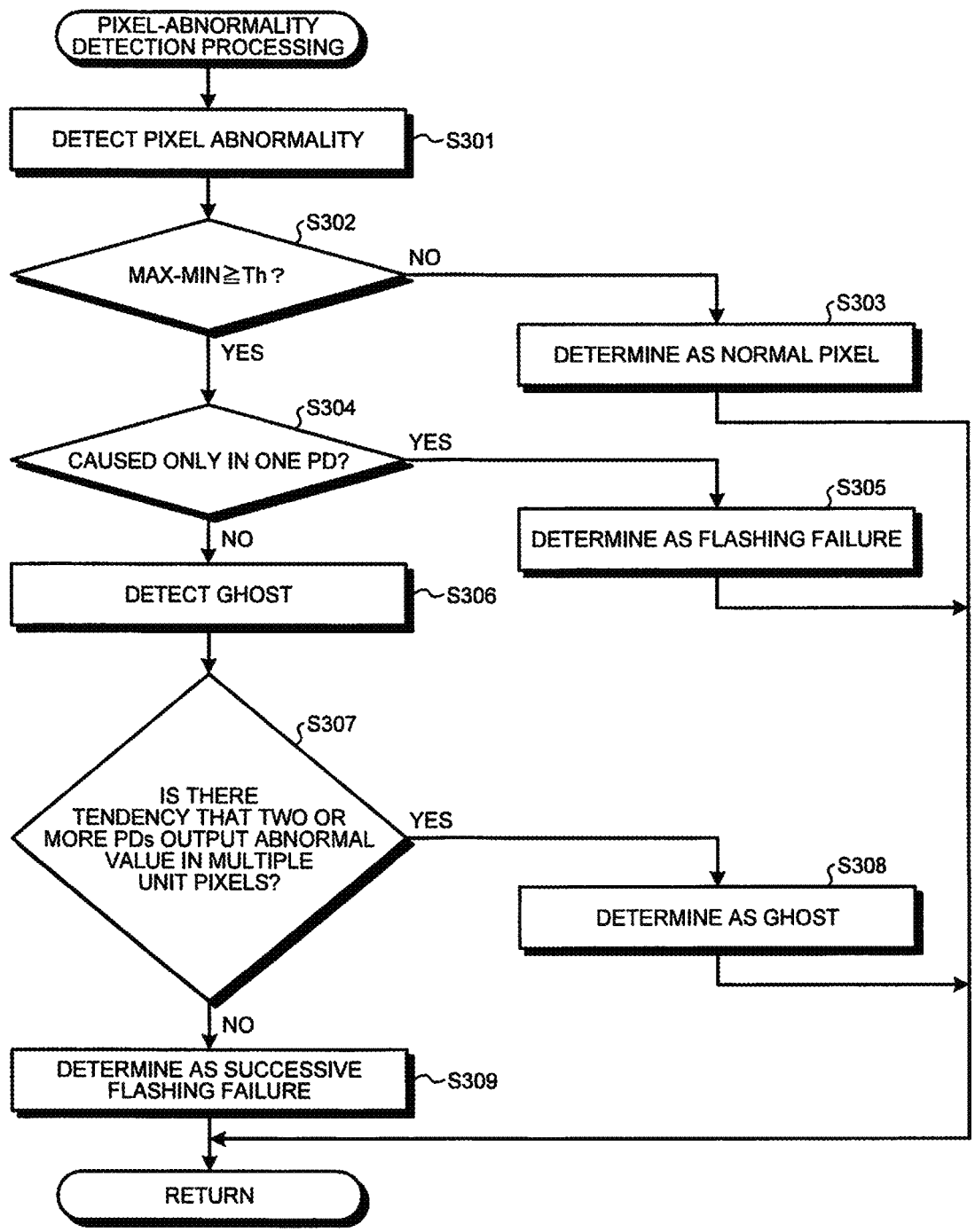
FIG. 14 is a flowchart illustrating an overview of pixel-abnormality detection processing performed by an abnormal-pixel determining unit included in the image processing apparatus according to a third embodiment of the disclosure.

FIG. 14 is a flowchart illustrating an overview of pixel-abnormality detection processing performed by the abnormal-pixel determining unit 31 included in the imaging apparatus 1 according to the third embodiment of the disclosure. In FIG. 14, an example in which detection of a pixel abnormality is performed with respect to the unit pixel G1 constituted of a set of four pieces of the photoelectric converting elements 241 (hereinafter, "PD1", "PD2", "PD3", "PD4" from the left) in FIG. 8 described above is described. Moreover, in the following, to signify either one out of the four pieces of the PD1 to PD4, it is described, expressing simply as "PD". Moreover, in the following, the pixel-abnormality detection processing performed with respect to one piece of the unit pixel G1 is described for convenience of explanation, but the abnormal-pixel determining unit 31 performs similar pixel-abnormality detection processing with respect to all of the unit pixels G1 constituting the imaging element 24.

As illustrated in FIG. 14, first, the comparing unit 311 starts detection of a pixel abnormality (step S301), and determines whether a difference between a maximum value (MAX) and a minimum value (MIN) among four output values output by the respective four PD1 to PD4 constituting the unit pixel G1 is equal to or larger than a threshold Th (step S302). When the comparing unit 311 determines that the difference between the maximum value (MAX) and the minimum value (MIN) among the four output values output by the respective four PD1 to PD4 constituting the unit pixel G1 is equal to or larger than the threshold Th (step S302: YES), the imaging apparatus 1 shifts to step S304 described later. On the other hand, when it is detected that the difference between the maximum value (MAX) and the minimum value (MIN) among the four output values output by the respective four PD1 to PD4 constituting the unit pixel G1 is not equal to or larger than the threshold Th (step S302: NO), the imaging apparatus 1 shifts to step S303.

Figure 15:
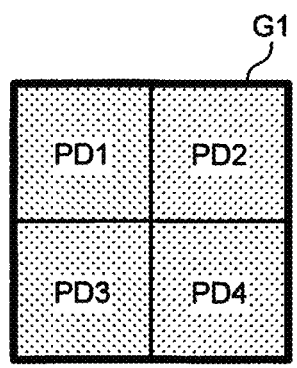
FIG. 15 illustrates a state in which each PD is a normal pixel in the pixel-abnormality detection processing in FIG. 14.

At step S303, the estimating unit 312 determines that the respective PD1 to PD4 constituting the unit pixel G1 are normal pixels (proper pixels) (step S303). Specifically, as illustrated in FIG. 15, when the difference between the maximum value (MAX) and the minimum value (MIN) among the four output values output by the respective four PD1 to PD4 constituting the unit pixel G1 is not equal to or larger than the threshold Th, the estimating unit 312 determines that the respective PD1 to PD4 constituting the unit pixel G1 are normal pixels (proper pixels). After step S303, the imaging apparatus 1 returns to the main routine in FIG. 6.

Figure 16:
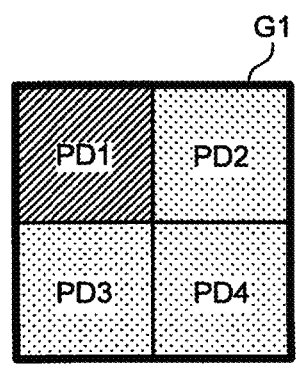
FIG. 16 illustrates a state in which a flashing failure has occurred in one PD in the pixel-abnormality detection processing in FIG. 14.

At step S304, the comparing unit 311 compares output values of the respective four PD1 to PD4 constituting the unit pixel G1, and determines whether an abnormal value is output by one PD only. When the comparing unit 311 compares the output values of the four PD1 to PD4 constituting the unit pixel G1 and determines that an abnormal value is output from one PD only (step S304: YES), the estimating unit 312 determines the one PD from which the abnormal value is output as a flashing failure (step S305). Specifically, as illustrated in FIG. 16, when an output value of the PD1 is different from respective output values of the other PD2, PD3, and PD4, the estimating unit 312 determines the PD1 as the flashing failure, which is the first pixel abnormality. After step S305, the imaging apparatus 1 returns to the main routine in FIG. 6.

At step S304, when the comparing unit 311 compares output values of four pieces of the photoelectric converting elements 241 constituting the unit pixel G1, and determines that an abnormal value is output by not one PD only (step S304: NO), the imaging apparatus 1 shifts to step S306.

Figure 17:
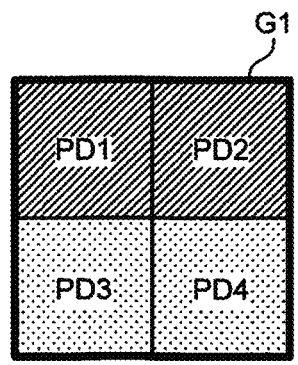
FIG. 17 illustrates a state in which a ghost is formed by incident light from a downward direction with respect to a unit pixel in the pixel-abnormality detection processing in FIG. 14.
Figure 18:
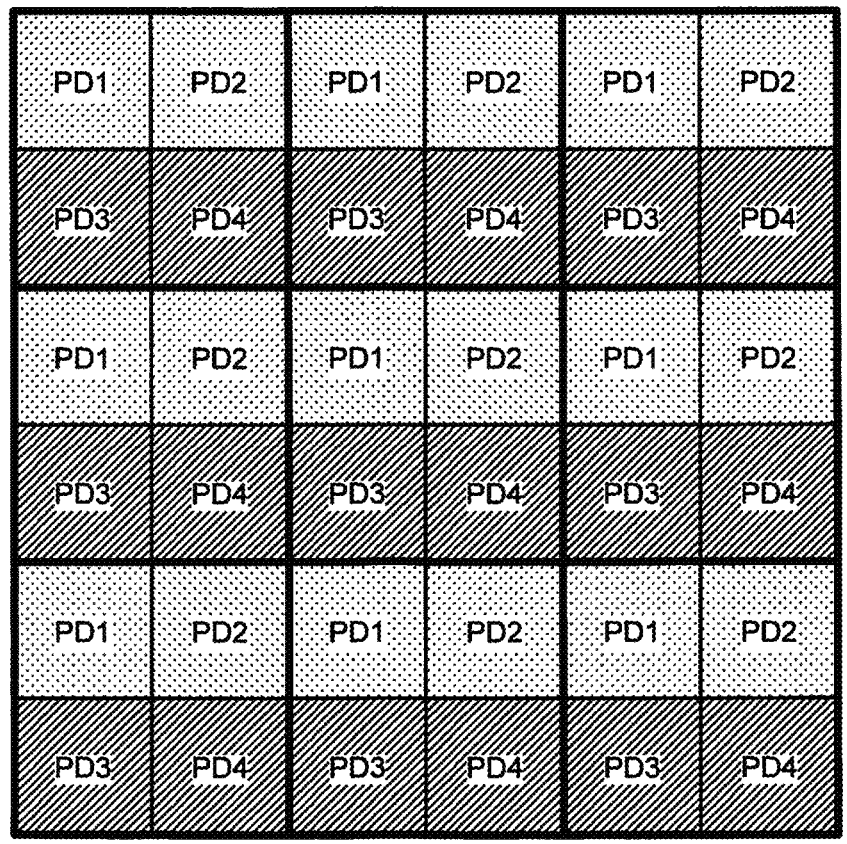
FIG. 18 illustrates a state in which a low-level ghost is formed in the pixel-abnormality detection processing in FIG. 14.

Subsequently, the comparing unit 311 starts detection of a ghost (step S306), and determines whether there is a tendency that two or more PDs output an abnormal value in more than one unit pixels G1 (step S307). Specifically, the comparing unit 311 determines whether the tendency that two or more PDs output an abnormal value among the multiple unit pixel G1 on which the same color filter is layered. For example, the comparing unit 311 determines whether two or more PDs output an abnormal value in each unit pixel G1 by at least either one method based on, for example, the multiple unit pixels G1 on a horizontal and a vertical lines, the number of the unit pixels G1 that is determined according to a capacity of the internal memory 10, and the number of at least two pieces of the horizontal or vertical unit pixels G1 set in advance. When the comparing unit 311 determines that two or more pieces of the PDs output an abnormal value in the multiple unit pixels G1 (step S307: YES), the estimating unit 312 determines that a ghost is formed (step S308). Specifically, as illustrated in FIG. 17, the estimating unit 312 determines that a ghost is formed in the PD1 and the PD2 by incident light from a downward direction. Moreover, as illustrated in FIG. 18, to improve the detection accuracy when a low-level ghost is formed, the estimating unit 312 determines it as a ghost when a ghost is formed in a predetermined number of or more pieces of unit pixels in a unit pixel area of at least 2×2 (for example, 1≈2>3≈4). Thus, it is possible to distinguish between a normal subject and a low-level ghost. After step S308, the imaging apparatus 1 returns to the main routine in FIG. 6.

At step S307, when the comparing unit 311 determines that there is no tendency that two or more PDs output an abnormal value in more than one unit pixel G1 (step S307: NO), the estimating unit 312 determines it as a successive flashing failure in which a flashing failure has occurred in two or more PDs out of the four PDs constituting the unit pixel G1 (step S309). After step S309, the imaging apparatus 1 returns to the main routine in FIG. 6.

According to the third embodiment of the disclosure described above, a similar effect to that of the first embodiment described above is produced, and a pixel abnormality can be detected in real time.

Other Embodiments

Moreover, in addition to a digital still camera, the imaging apparatus according to the disclosure is applicable to a display device or the like that displays an image corresponding to image data for a medical use or industrial use imaged by a digital video camera, an electronic device, such as a tablet portable device, and an endoscope or a microscope having an imaging function.

Furthermore, a program that is executed by the imaging apparatus according to the disclosure is provided, recorded on a computer-readable recording medium, such as a compact disk read-only memory (CD-ROM), a flexible disk (FD), a compact disk recordable (CD-R), a digital versatile disk (DVD), a universal serial bus (USB) medium, and a flash memory, as file data in a installable format or an executable format.

Moreover, a program that is executed by the imaging apparatus according to the disclosure may be stored in a computer connected to a network such as the Internet, to be provided by being downloaded through the network. Furthermore, the program that is executed in the imaging apparatus according to the disclosure may be provided or distributed through a network such as the Internet.

Although a sequential relation of processing among steps is specified by using expressions, such as "first", "thereafter", and "subsequently", in the description of the flowcharts in the present specification, it is noted that the order of processing to implement the disclosure is not uniquely specified by those expressions. That is, the order of processing in the flowcharts described in the present specification may be changed within a range not causing a contradiction.

As described, the disclosure can include various embodiments not described herein, and various design changes and the like are possible within a scope of technical thoughts specified in claims.

According to the disclosure, an effect that a pixel abnormality can be detected in real time is produced.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image processing apparatus comprising:
a comparing circuit configured to compare, based on image data generated by an imaging element including a light receiver in which four or more pieces of photoelectric converting elements form a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and
an estimating circuit configured to estimate an abnormality by using output values of the respective photoelectric converting elements in the unit pixel from which the comparing circuit detects the abnormal output, wherein
when the comparing circuit detects abnormal outputs from at least two unit pixels in the plurality of unit pixels and detects that at least two output values of the output values of the photoelectric converting elements in each of the at least two unit pixels are the abnormal outputs, the estimating circuit is configured to
estimate photoelectric converting elements that have output the abnormal outputs as a pixel abnormality caused by a flashing failure when, in the at least two unit pixels, the number of unit pixels between which positions of the photoelectric converting elements that have output the abnormal outputs in the respective unit pixels are the same is less than a predetermined number, and
estimate photoelectric converting elements that have output the abnormal outputs as a pixel abnormality caused by ghost light when, in the at least two unit pixels, the number of unit pixels between which positions of the photoelectric converting elements that have output the abnormal outputs in the respective unit pixels are the same is the predetermined number or more.

2. The image processing apparatus according to claim 1, wherein
the estimating circuit is configured to
estimate the photoelectric converting elements that have output the abnormal outputs as the pixel abnormality caused by the flashing failure when, in the at least two unit pixels, the number of unit pixels where filters of the same color are layered and between which positions of the photoelectric converting elements that have output the abnormal outputs in the respective unit pixels are the same is less than the predetermined number, and
estimate the photoelectric converting elements that have output the abnormal outputs as the pixel abnormality caused by the ghost light when in the at least two unit pixels the number of unit pixels where filters of the same color are layered and between which positions of the photoelectric converting elements that have output the abnormal outputs in the respective unit pixels are the predetermined number or more.

3. The image processing apparatus according to claim 1, wherein
the estimating circuit is configured to
estimate the photoelectric converting elements that have output the abnormal outputs as the pixel abnormality caused by the flashing failure, when in the at least two unit pixels, the number of unit pixels that are two or more unit pixels preset in a horizontal direction and a vertical direction and between which positions of the photoelectric converting elements that have output the abnormal outputs in the respective unit pixels are the same is less than the predetermined number, and
estimate the photoelectric converting elements that have output the abnormal outputs as the pixel abnormality caused by the ghost light, when in the at least two unit pixels, the number of unit pixels that are two or more unit pixels preset in a horizontal direction and a vertical direction and between which positions of the photoelectric converting elements that have output the abnormal outputs in the respective unit pixels are the same is the predetermined number or more.

4. An imaging apparatus comprising:
the imaging element;
the image processing apparatus according to claim 1;
a lens configured to form an image of a subject on a light receiving surface of the imaging element; and
a memory, wherein
the image processing apparatus is configured to
cause the imaging element to perform imaging to generate image data, and
record position information relating to a position of the photoelectric converting element that has been estimated as abnormal, and a type of pixel abnormality that the pixel abnormality is caused by the flashing failure or by the ghost light in an associated manner in the memory.

5. An image processing apparatus comprising:
a comparing circuit configured to compare, based on image data generated by an imaging element including a light receiver in which four or more pieces of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and
an estimating circuit configured to estimate an abnormality by using output values of the respective photoelectric converting elements in the unit pixel from which the comparing circuit detects the abnormal output, wherein
when the comparing circuit detects that one of the output values is different from other output values out of the respective output values of the photoelectric converting elements in the unit pixel and detects the one of the output values as an abnormal output, the estimating circuit is configured to estimate a photoelectric converting element that has output the one of the output values as a pixel abnormality caused by a flashing failure, and
when the comparing circuit (1) detects abnormal outputs from at least two unit pixels in the plurality of unit pixels, (2) detects that at least two output values of the output values of the photoelectric converting elements in each of the at least two unit pixels are at a different level from other output values of the output values of the photoelectric converting elements in each of the at least two unit pixels, and (3) detects the at least two output values as the abnormal outputs, the estimating circuit is configured to estimate photoelectric converting elements that have output the at least two output values as a pixel abnormality caused by ghost light.

6. The image processing apparatus according to claim 5, wherein
the estimating circuit is configured to estimate an incident direction of the ghost light based on a position of the pixel abnormality caused by the ghost in the unit pixels.

7. The image processing apparatus according to claim 5, further comprising:
a memory, wherein
the estimating circuit is configured to record position information relating to a position of the photoelectric converting element estimated as abnormal and a type of pixel abnormality that the pixel abnormality is caused by the flashing failure or by the ghost light in the memory.

8. The image processing apparatus according to claim 5, further comprising
an input device configured to receive an input of an instruction signal to instruct execution of estimation by the estimating circuit, wherein
the estimating circuit is configured to estimate, when the instruction signal is input from the input device, an abnormality by using output values of the respective photoelectric converting elements in the unit pixel from which the comparing circuit detects the abnormal output.

9. An imaging apparatus comprising:
the imaging element;
the image processing apparatus according to claim 5;
a lens configured to form an image of a subject on a light receiving surface of the imaging element; and
a memory, wherein
the image processing apparatus is configured to
cause the imaging element to perform imaging to generate image data, and
record position information relating to a position of the photoelectric converting element that has been estimated as abnormal, and a type of pixel abnormality that the pixel abnormality is caused by the flashing failure or by the ghost light in an associated manner in the memory.

10. A pixel-abnormality detecting method comprising:
comparing, based on image data generated by an imaging element including a light receiver in which four or more pieces of photoelectric converting elements forms a set of a unit pixel and in which a plurality of unit pixels are arranged in a two-dimensional matrix, and a micro lens that is provided per unit pixel and is layered on a light receiving surface of the unit pixel, output values of the respective photoelectric converting elements per unit pixel to detect an abnormal output; and
estimating an abnormality by using output values of the respective photoelectric converting elements in the unit pixel from which the abnormal output is detected at the comparing, wherein
when the comparing detects abnormal outputs from at least two unit pixels in the plurality of unit pixels and detects that at least two output values of the output values of the photoelectric converting elements in each of the at least two unit pixels are the abnormal outputs, the estimating includes
estimating photoelectric converting elements that have output the abnormal outputs as a pixel abnormality caused by a flashing failure, when in the at least two unit pixels, the number of unit pixels between which positions of the photoelectric converting element that have output the abnormal outputs in the respective unit pixels are the same is less than a predetermined number, and
estimating photoelectric converting elements that have output the abnormal outputs as a pixel abnormality caused by ghost light, when in the at least two unit pixels, the number of unit pixels between which positions of the photoelectric converting elements that have output the abnormal outputs in the respective unit pixels are the same is the predetermined number or more.

11. The pixel abnormality detecting method according to claim 10, wherein
the estimating includes
estimating the photoelectric converting elements that have output the abnormal outputs as the pixel abnormality caused by the flashing failure when in the at least two unit pixels the number of unit pixels where filters of the same color are layered and between which positions of the photoelectric converting elements that have output the abnormal outputs in the respective unit pixels are the same is less than the predetermined number, and
estimating the photoelectric converting elements that have output the abnormal outputs as the pixel abnormality caused by the ghost light when in the at least two unit pixels the number of unit pixels where filters of the same color are layered and between which positions of the photoelectric converting elements that have output the abnormal outputs in the respective unit pixels are the same is the predetermined number or more.

12. The pixel-abnormality detecting method according to claim 10, wherein
the estimating includes
estimating the photoelectric converting elements that have output the abnormal outputs as the pixel abnormality caused by the flashing failure when in the at least two unit pixels the number of unit pixels that are two or more unit pixels preset in a horizontal direction and a vertical direction and between which positions of the photoelectric converting elements that have output the abnormal outputs in the respective unit pixels are the same is less than the predetermined number, and
estimating the photoelectric converting elements that have output the abnormal outputs as the pixel abnormality caused by the ghost light when in the at least two unit pixels the number of unit pixels that are two or more unit pixels preset in a horizontal direction and a vertical direction and between which positions of the photoelectric converting elements that have output the abnormal outputs in the respective unit pixels are the same is the predetermined number or more.

13. The pixel-abnormality detecting method according to claim 10, further comprising:
causing the imaging element to perform imaging to generate image data; and
recording position information relating to a position of the photoelectric converting element that has been estimated as abnormal, and a type of pixel abnormality that the pixel abnormality is caused by the flashing failure or by the ghost light in an associated manner in a memory.

14. A non-transitory computer-readable recording medium with an executable program causing an image processing apparatus to execute:

comparing, based on image data generated by an imaging element that includes a light receiver in which four or more pieces of photoelectric converting elements forms a set of a unit pixel and in which a plurality of the unit pixels are arranged in a two-dimensional matrix, and a micro lens that is provided per unit pixel and is layered on a light receiving surface of the unit pixel, output values of the respective photoelectric converting elements per unit pixel to detect an abnormal output; and estimating an abnormality by using output values of the respective photoelectric converting elements in the unit pixel from which the abnormal output is detected at the comparing, wherein when the comparing detects abnormal outputs from at least two unit pixels in the plurality of unit pixels and detects that at least two output values of the output values of the photoelectric converting elements in each of the at least two unit pixels are the abnormal outputs, the estimating includes estimating photoelectric converting elements that have output the abnormal outputs as a pixel abnormality caused by a flashing failure, when in the at least two unit pixels, the number of unit pixels between which positions of the photoelectric converting elements that have output the abnormal outputs in the respective unit pixels are the same is less than a predetermined number, and estimating photoelectric converting elements that have output the abnormal outputs as a pixel abnormality caused by ghost light, when in the at least two unit pixels, the number of unit pixels between which positions of the photoelectric converting elements that have output the abnormal outputs in the respective unit pixels are the same is the predetermined number or more.

15. The non-transitory computer-readable recording medium according to claim 14 wherein the estimating includes estimating the photoelectric converting elements that have output the abnormal outputs as the pixel abnormality caused by the flashing failure when in the at least two unit pixels the number of unit pixels where filters of the same color are layered and between which positions of the photoelectric converting elements that have output the abnormal outputs in the respective unit pixels are the same is less than the predetermined number, and estimating the photoelectric converting elements that have output the abnormal outputs as the pixel abnormality caused by the ghost light when in the at least two unit pixels the number of unit pixels where filters of the same color are layered and between which positions of the photoelectric converting elements that have output the abnormal outputs in the respective unit pixels are the same is the predetermined number or more.

16. The non-transitory computer-readable recording medium according to claim 14, wherein the estimating includes estimating the photoelectric converting elements that have output the abnormal outputs as the pixel abnormality caused by the flashing failure when in the at least two unit pixels the number of unit pixels that are two or more unit pixels preset in a horizontal direction and a vertical direction and between which positions of the photoelectric converting elements that have output the abnormal outputs in the respective unit pixels are the same is less than the predetermined number, and estimating the photoelectric converting elements that have output the abnormal outputs as the pixel abnormality caused by the ghost light when in the at least two unit pixels the number of unit pixels that are two or more unit pixels preset in a horizontal direction and a vertical direction and between which positions of the photoelectric converting elements that have output the abnormal outputs in the respective unit pixels are the same is the predetermined number or more.

17. The non-transitory computer-readable recording medium according to claim 14 wherein the executable program further causes the image processing apparatus to execute causing the imaging element to perform imaging to generate image data, and recording position information relating to a position of the photoelectric converting element that has been estimated as abnormal, and a type of pixel abnormality that the pixel abnormality is caused by the flashing failure or by the ghost light in an associated manner in a memory.

* * * * *